United States Patent [19]

Bergmann et al.

[11] Patent Number: 4,762,756
[45] Date of Patent: Aug. 9, 1988

[54] THERMOCHEMICAL SURFACE TREATMENTS OF MATERIALS IN A REACTIVE GAS PLASMA

[75] Inventors: Erich Bergmann, Mels; Elmar Hummer, Satteins, both of Austria

[73] Assignee: Balzers Aktiengesellschaft, Liechtenstein

[21] Appl. No.: 62,226

[22] Filed: Jun. 12, 1987

[30] Foreign Application Priority Data

Jun. 13, 1986 [CH] Switzerland .................. 02415/86

[51] Int. Cl.⁴ .............................................. B32B 9/00
[52] U.S. Cl. .............................. 428/698; 204/192.12; 204/192.15; 204/192.31; 427/39; 427/47; 428/688; 428/699; 428/704
[58] Field of Search ................ 427/39, 47; 428/688, 428/699, 704, 698; 204/192.12, 192.15, 192.31

[56] References Cited

U.S. PATENT DOCUMENTS 4,645,895  2/1987  Boxman et al. .................. 427/37 X Primary Examiner—Bernard D. Pianalto
Attorney, Agent, or Firm—McGlew and Tuttle

[57] ABSTRACT

A method for the thermochemical surface treatment of workpieces in a reactive gas plasma is disclosed in which an appreciable reduction in the amount of reactive gas and energy used is achieved by working at gas pressures below 10 pascals (Pa). Particularly advantageous results are achieved with a low-voltage electrical arc discharge, which leads to an ionization of the gases used (about 50%) that is substantially higher than that, which is achieved with the methods described in the art 6 (approximately 1%). Surfaces, treated by such a conduct of the reaction, are distinguished by an increased hardness and better wear properties. The method of the invention moreover allows more numerous variation possibilities than do the methods described in the art and enables the conduct of the method to be adapted in a flexible manner to the specific requirements of the particular case. The inventive method permits a time sequence of the several treatment steps with different reactive gases or gas mixtures and thus a combination of different foreign elements in the treated substrate surface.

28 Claims, 1 Drawing Sheet

THERMOCHEMICAL SURFACE TREATMENTS OF MATERIALS IN A REACTIVE GAS PLASMA

FIELD AND BACKGROUND OF THE INVENTION

The present invention relates to a method for the thermochemical surface treatments of materials in a reactive gas plasma, as well as to products produced with this method. The plasma heat treatment in reactive gases or gas mixtures is used industrially for such purposes as nitriding and nitrocarburizing. Compared to conventional heat-treatment methods with gas media, salt-bath media or powdery donor media, plasma heat treatment in reactive gases or gas mixtures has the advantage that a plurality of different types of layers can be produced, the properties of which can be adapted to the particular operational requirements (cf. Th. LAMPE, Plasma Treatment of Iron Materials in Nitrogen- and Carbon-Containing Gas Mixtures, Progress Reports of the VDI series 5, No. 93, Dusseldorf 1985, pages 1 ff).

As a rule, direct-current glow-discharge has been used in the past for the industrial application of this plasma heat treatment. Because of the high kinetic energy of the ions produced in the plasma, the treatment was carried out in the area of the so-called anomalous unstable and high-current glow discharge. The important process parameters, available for this procedure, are the discharge conditions of the glow discharge (type of current, current density and voltage), the composition of the reactive gases, the gas pressure, the gas throughput, the temperature of the substrate, the duration of the treatment and the cooling conditions.

In practice, plasma heat-treatment installations predominantly work with a constant direct current, the discharge voltages lying between 300 and 1500 V. Depending on the conditions, the power densities amount to between 0.1 and 4 W/cm$^2$ (LAMPE, loc. cit. 5. 47). Gas mixtures of nitrogen, hydrocarbon and hydrogen or argon are used for nitrocarburizing and carbonitriding (W. L. GRUBE et al., J. Heat Treating 2 (1982), 211–216) and pure hydrocarbons (($CH_4$, $C_3H_8$) or mixture of these gases with hydrogen and nitrogen for carburizing (V. N. BLINOV, Metal Sci. Heat Treatm. 24 (1982), 45–47). For plasma nitriding or plasma nitrocarburizing, temperatures between 350° and 700° C. were usually employed 9B. EDENHOFER et al., Harterei-Tech. Mitt. 35 (1980), 175-181) and for carburizing and carbonitriding temperatures between 800° and 1000° C. (W. L. GRUBE et al., J. Heat Treating 2 (1982), 211–216). The gas pressure employed in these processes generally was between 0.5 and 15 mbar, corresponding to 50 to 1500 pascal (Pa), the treatment being carried out under a static partial vacuum (without flow of the working gas) as well as under a dynamic partial vacuum (with flow of the working gas) in an open cycle (cf. LAMPE loc. cit., pages 47/48, H. WILHELMI et al., Harterei-Tech. Mitt. 37 (1982), 263–269, T. WIERZCHON et al., Harterei-Tech. Mitt. 36 (1981), 189–193). This gas pressure is required, on the one hand, to ensure reliable operation of the glow discharge at voltages below 2 kV and, on the other, to improve the relatively modest yields of the process, which may be attributed to the face that the ionized portion of the reaction gas during the glow discharge is less than 1%. It follows from this that almost the whole of the energy is used under these conditions to heat the substrate to the treatment temperature and not to introduce ions into the surface of this substrate. Accordingly, these methods of the state of the art can be regarded as thermochemical methods, in which the heat is supplied over the plasma and the ion process merely represents a subsidiary aspect and a slight improvement of the method.

SUMMARY AND OBJECT OF THE INVENTION

It is the object of the present invention to both increase the relatively slight yield of the process and to improve the utilization of the reactive gas or gas mixture employed by increasing the proportion of ionization and to use the energy employed to a greater degree for the introduction of ions into the substrate surface and to a lesser degree for heating the same. Thereby the energy consumption is lowered by the method for the specified treatment quality.

It is a further object of the invention to expand the possibilities of varying the individual process parameters as well as the properties of the treated substrate surface, and to increase the operational reliability of the method.

These objectives of the invention are accomplished by a method for the thermochemical surface treatment of materials in a reactive gas plasma, which includes establishing pressure in a reaction chamber less than 10 pascals (Pa). Surprisingly, it has turned out that, by conducting the reaction in this manner, an appreciable reduction in the amount of reactive gas and energy used is achieved, and most importantly the surfaces, treated by a reaction conducted in such a manner, also have properties, which are superior to those of surfaces described in the art.

Finally this selection of reaction parameters has the additional advantage of permitting substantially more numerous variation possibilities and thus of adapting the method in a flexible manner to the specific requirements with respect to the composition of the reactive gas mixture and with respect to the properties of the substrate and of the treated surfaces.

This manner of conducting the process presupposes the use of a plasma, which is different from that described in the art. The most advantageous results are moreover achieved with a low voltage arc discharge with gas-stabilized thermionic cathodes. However, other plasmas also appear to be suitable for carrying out the method of the invention. In industrial equipment, such a plasma burns at a pressure below 1 pascal. The arc discharge, moreover, leads to an ionization of the gas used, which is substantially more intensive than that in the method described in the art, it being possible to assume that about half the gas atoms are present in the ionized state. The ions produced are accelerated by a low direct-current voltage of a few hundred volts onto the substrate surface, where they first of all penetrate into the substrate surface and then diffuse further into the material with relatively little hindrance. The substrate is heated in a separate process either with the help of a special heater or in the arc discharge itself. Because the reaction is conducted at a low pressure, it is possible to accelerate the ions practically at will and thus to provide them with a momentum which both assures adequate penetration of the material and also is not so high, that unwanted atomization of the material or an equally unwanted conversion into heat consumes a substantial portion of this expensive form of energy.

Since the ions are obtained from the reservoir of the arc and accelerated without further brake shocks onto the substrate, their energy distribution can be fixed more precisely than in the methods with higher gas pressures described in the art, in which the process steps of generating, accelerating and braking the ions by shocks are inseparably connected.

The depth distribution of the foreign elements, injected into the various substrate materials in the course of the ion implantation, depends essential on the atomic number of these elements. Since these are known to a large extent, the inventive conduct of the process of the present invention offers almost any variational possibilities depending on the desired nature of the surface treatment. The method offers the additional advantage that, owing to the relatively low gas pressure of less than 10 Pa, any material vaporized in spite of the appropriate measures taken is not transported back to the surface of the substrate. As a result, the condition of this surface remains unchanged during the course of the process and retains the properties, which appear to be most suitable for the first absorption of the reactants.

Further, the method of the invention has the further advantage that it can be integrated, without difficulty into an ion-plating coating method.

The superior properties, achieved with this method including conducting the process with a low-voltage arc discharge, are all the more surprising, since it has been emphasized in the art that an oxidation (for example a nitriding) of substrate atoms, which have been detached from the substrate surface by the atomization of the solid, and a transport of this oxidized material back to the substrate surface, constitute an essential step of the surface treatment (KOELBEL, J., Research Reports of the Nordrhein-Westfalen Land, No. 1555, Cologne 1965, and KOELBEL, J., Technical Report of the Institute of the Society to Promote Glow-Discharge Research, Cologne, 1966, as well as LAMPE, loc. cit. pages 29/30. For such a transport back, gas pressures substantially higher than 50 pascals would be required.

The advantageous properties of conducting the method with a low-voltage arc discharge are also surprising because, for reasons of operational reliability. Explicit warning is given in the art against the use of an arc discharge and, with this, against the use of low pressures or the inadvertent transition from a glow discharge to an arc discharge in thermochemical plasma treatments.

When using an arc discharge, the whole of the power is given off in a narrow region of the arc column, which leads to local destruction of the substrate surface and prevents the undisturbed implementation of the treatment, especially in the case of large components (LAMPE, loc. cit. page 47).

To prevent such an unwanted transition, it was proposed to provide plasma heat treatment installations, which operate with a constant direct current, with a special electrical circuit to avoid the arc discharge (T. KARPINSKI, Schweiz Maschinenmarkt 78 (1978), 60–63).

For the similar reason, it was proposed that the glow discharge not be supplied with a constant direct current, but with current pulses with a variable repetition rate, by means of which the flow discharge is also stabilized and the formation of an arc discharge is largely prevented (P. COLLIGNON, Heat Treatm. of Metals 9 (1982), 67–70).

Accordingly it is an object of the invention to provide a special advantageous embodiment of the method comprising adjusting the gas pressure in the reaction chamber to a value in the range from 0.06 to 0.6 Pa.

According to a further preferred embodiment of the invention, the gas plasma, required for carrying out the method, can be generated in an electrical arc discharge of low voltage. How ever, other method steps also appear to be suitable for this purpose. This electrical arc discharge can be maintained, for example, between a heated and gas-stabilized cathode and a liquid-cooled anode and guided by a magnetic field, the lines of flux of which are essentially perpendicular to the flow of the reactive gas or gas mixture. This arc discharge can, moreover be used at the same time for heating the substrate. In most cases it has furthermore proven to be advantageous to subject the materials, which are to be treated, to plasma-chemical etching before they are subjected to the inventive surface treatment.

Not only has the method of the invention shown the chemical engineering advantages described, but it has also surprisingly turned out that substrates, treated according to the method, have properties, which are distinguished by the following series of substantial advantages over the properties of surfaces, which are disclosed in the art and produced at gas pressures higher than 10 Pa. Since the recrystallization, which occurs when the method is carried out at pressures higher than 10 Pa, is largely avoided with the inventive method, the treated surfaces have a higher hardness and better wear properties. For example, after nitrocarburizing, an increase in the hardness of zones near the surface from 600 to 1400 vickers can be noted.

The surfaces, treated by the method of the invention, may moreover be optimally adapted to the tribological stress in the particular application case, insofar as this method permits the connecting layer and the diffusion layer to be controlled separately, in the sense that, for given properties of the diffusion layer, the connecting layer can either be avoided or especially promoted. In this connection, it should be taken into consideration that, because of their brittleness, connecting layers are undesirable for many applications and frequently must be removed from the substrate with considerable expenditure of work. This applies particularly in those cases, in which the surface treatment in the gas plasma is combined with a further process step, such as the application of layers as protection against wear and tear utilizing physical or chemical processes (so-called physical vapor deposition PVD or chemical vapor deposition CVD) or any combination of the two. For the physical processes (so-called physical vapor deposition) of such combinations, especially the processes of ion plating, cathode sputtering or spark vaporizing or any combination of these come into consideration.

The inventive method allows not only an almost unlimited number of possibilities for varying the generation of surfaces, which appear to be especially advantageous for a particular application. In contrast to the methods disclosed in the art, the inventive method also allows a timed sequence of several treatment steps with different reactive gases or gas mixtures and thus a combination of different foreign elements in the treated substrate surface.

In the methods described in the art, it is well known that the depth distribution of the foreign elements introduced, approximately represents a normal distribution (LAMPE, loc. cit. pages 21 and 182). According to the inventive procedure, it has now proven to be advantageous to superimpose, by a suitable selection of process parameters, different ion drift rates on the normal distributions of the foreign elements and thereby to increase the average value of the depth of penetration. If several foreign elements are introduced simultaneously or consecutively into the surface, particularly advantageous properties of the treated surface are achieved, if the depth distributions of the foreign elements in question vary with respect to their average values as well as with respect to their standard deviations. When several foreign elements are implanted, particularly advantageous properties are obtained, if the average values of the depth distributions are inversely proportional to the enthalpy of formation of the metalloid in question from the substrate material or to the enthalpy of reaction of the element in question with the substrate material.

Various features of novelty which characterize the invention are pointed out with particularity in the claims annexed to and forming a part of this disclosure. For a better understanding of the invention, its operating advantages and specific objects obtained by its uses, reference is to the accompanying drawing and descriptive matter in which preferred embodiments of the invention are illustrated.

DESCRIPTION OF THE PREFERRED EMBODIMENT

Figure 1:
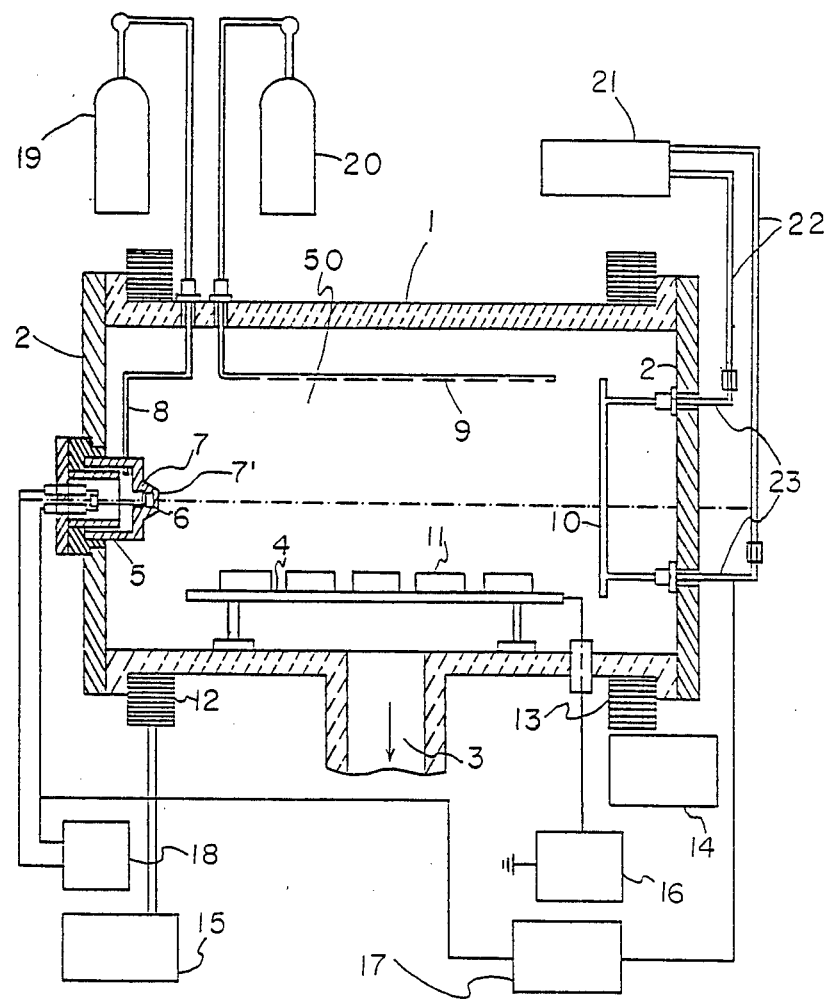
FIG. 1 shows a schematic longitudinal section through an equipment arrangement for carrying out the method of the invention.

This inventive arrangement of equipment includes a cylindrical reaction chamber 50, which is constructed from a casing part 1 of steel and two metal plates 2, which are fastened by means of flanges to the two end faces of the casing part 1. This reaction chamber is evacuated by means of pump connection pieces 3 connected to a pump (not shown). The floor casing part supports a substrate holder 4 which is positioned in the interior of the chamber 50.

A chamber 5 is disposed at the end face of the chamber 50, proximate one of the metal plates, for a thermionic cathode 4. On the side facing the reaction chamber 50, the chamber 5 is closed off by a hollow, conical lid 7 with a central opening 7'. A gas supply line 8, through which an inert gas for the thermionic cathode, such as argon, can be introduced, opens out into this thermionic cathode chamber 5. A second gas supply line 9 opens out into the reaction chamber and serves to supply the reactive gas or gas mixture desired for the surface treatment. A plate- or rod-shaped anode 10 is affixed to the end face of the reaction chamber opposite to the thermionic cathode. A low voltage arc discharge for the surface treatment of the substrate 11 is maintained between this anode and the thermionic cathode 6.

The equipment contains two magnetized coils 12 and 13, the function of which is to collimate the electric arc discharge along the main axis of the equipment and which are supplied by the power supply units 14 and 15. The direction of flow of the reaction gas, supplied over line 9, is essentially perpendicular to the direction of the magnetic field.

For the surface treatment, an appropriate voltage relative to the reaction chamber and relative to the arc plasma must be applied to the substrate, for which purpose the voltage supply unit 16 is used. The current for the arc discharge between the thermionic cathode 6 and the anode 10 is supplied by a power supply unit 17 connected to cathode 6 and anode 10. The equipment additionally includes a device 18, with element in chamber 5, for supplying the thermionic cathode 6 with the required heating current, a gas tank 19, connected to chamber 5, to provide the inert gas that is supplied to the thermionic cathode chamber 5, as well as a second gas tank 20, connected by supply line 9 to provide the reactive gas or gas mixture. The required cooling medium, such as cooling water, comes from the device 21 and is circulated over pipelines 22 through the anode 2, which is provided with appropriate cavities. Copper tubes 23, in an insulated mounting, serve to pass these pipelines through the end face at the anode side of the reaction chamber. At the same time, these copper tubes 23 conduct the electric current, supplied by the device 17 to the anode 10.

To carry out the surface treatment pursuant to the invention, the substrates 11, which are to be treated, are first placed on holders 4, after which the reaction chamber is evacuated to a pressure of less than 0.01 Pa. Subsequently, the substrates are heated to the required temperature. This can be done with special heaters or with the arc discharge itself. In order to conduct the surface treatment precisely, the temperature must be controlled with an accuracy of ±2° C. During the heating period, an inert gas atmosphere of argon, for example, can be maintained in the whole of the reaction chamber.

After the substrates have been heated up, the surfaces, which are to be treated, are advisably subjected to an ion etching process. Various known processes can be employed for this purpose, such as high-voltage diode or triode direct-current etching, the etching either being carried out in a neutral gas or, if specific impurities are to be removed simultaneously, in a reactive gas such as hydrogen or chlorine. The facilities for carrying out such an etching procedure may be installed in the reaction chamber. However, it appears to be simpler and more appropriate to utilize the electrodes present for the etching, for example, by a direct-current discharge between the substrate 11 at ground potential and the anode 10. For this purpose, an appropriate positive voltage must be temporarily applied to the anode, as a result of which, when the pressure in the reaction chamber is sufficiently low, a glow discharge with a discharge current of a few mA can be maintained. Of course, the low voltage arc can also be used as an ion donor for the etching.

Various examples of the operation of the invention are described in greater detail in the following by means of experimental examples the individual reaction parameters are summarized in TABLE 1.

EXAMPLE 1

Foreign Element—N

Workpieces of S 6-5-2 high-speed steel were treated in a low-voltage arc discharge, the thermionic cathode, which was essentially at ground potential, being heated with 1.8 kW and a voltage of 78 volt relative to ground being maintained at the anode. The voltage, moreover, was controlled, so that there was a constant arc current of 115 amperes.

Subsequently a negative potential of −600 volt was applied to the holder 4 and the reactive gas, comprising a mixture of nitrogen (15 volume percent), argon (45 volume percent) and hydrogen (40 volume percent), was introduced. The gas flow was set at 390 scc/min, resulting in a gas pressure of 0.5 Pa in the reaction chamber (scc=standardized cc at 760 torr and 298° C.). The temperature of the workpieces during the treatment was 530° C. After one hour of treatment, the electric arc discharge was stopped. The work pieces, treated according to this method, had a surface hardness HV0.05=1800 (Vickers method of measuring hardness with a test load of 50 g, DIN 50 133) and a depth of penetration of 20μ.

EXAMPLE 2

Foreign Elements—C and N

The method of Example 1 was essentially retained, but a negative potential of only 31 400 volt was used. The gas mixture employed consisted of 25 volume percent nitrogen and 75 volume percent benzene vapor and the gas flow was adjusted to 420 scc/min., corresponding to a gas pressure of 0.4 Pa in the reaction chamber. The treatment period was unchanged at one hour and the workpieces were maintained at a temperature of 480° C. during the treatment.

For comparison, workpieces of the same variety of steel were treated according to a known method at a pressure of 550 Pa and a temperature of 480° C. for 3 hours with a mixture of methane, nitrogen and hydrogen, a constant volume ratio of 12% hydrocarbon, 55% nitrogen and 33% hydrogen being maintained. Whereas the hardness of formed parts, treated according to the inventive method, rose in the surface zones from HV0.1=600 to 1400, it increased by 550 Pa due to the treatment with the known method to a value of only HV0.1=1100 (Vickers method of measuring the hardness with a test load of 100 g, DIN 50 133). The wear rate of the treated workpieces was determined in an abrasion test, in which a ring was rotated flat on a disk, the load being 500 kg and the speed 0.01 m/sec (cf. K. H. HABIG, Verschleiss und Harte von Werkstoffen, (Wear and Hardness of Materials), Munich/Vienna 1980, pages 62 ff).

The linear wear rate according to DIN 50 321 was 1.2 μm/min for work pieces treated according to the method of the invention, while it was more than twice as high (2.7 μm/min) for pieces treated according to the known method.

EXAMPLE 3

Foreign Element—C

Formed parts of Ck 15 material were treated at a pressure of 0.2 Pa and a temperature of 920° C. for three hours with a gas mixture of 80 volume percent acetylene and 20 volume percent hydrogen. At the end of the treatment, the pieces were quenched in a vacuum quenching oil and tempered at 190° C. For comparison, formed parts of the same material were treated at a gas pressure of 20 Pa and a temperature of 920° C. also for 3 hours with methane. While the treated workpieces did not differ in hardness (100 Brinell), the endurance life of the pieces, treated according to the method of the invention, was approximately 10 times as long in the wear test (38 hours) as that of pieces treated according to the known method (approximately 4 hours; ASTM D 2670 wear test: Falex; cf. HABIG, loc. cit., page 63).

EXAMPLE 4

Foreign Element—Cr

Workpieces of 18/8 steel were treated for 40 minutes at a gas pressure of 0.4 Pa and a temperature of 980° C. with a gas mixture of 70 volume percent $CrCl_2$ and 30 volume percent hydrogen. For comparison, workpieces of the same type of steel were also subjected to a 40-minute treatment with a gas mixture of 49 volume percent $CrCl_2$, 49 volume percent $H_2$ and 2 volume percent $NH_4I$ at a temperature of 1100° C. and a pressure of 10,000 Pa. The treated pieces were subjected to a corrosion test for watch components, which essentially consisted of exposure of the material for 72 hours at 40° C. to 100% relative humidity with daily spraying with an electrolyte solution of the following composition: NaCl 20 g/L, $NH_4Cl$ 17.5 g/L, urea 5 g/L, acetic acid 2.5 g/L, lactic acid 15 g/L, pyruvic acid 2.5 g/L and butyric acid 5 g/L. After a single repetition of this corrosion test, the material, treated according to the known method, had 46 defects on 10 $cm^2$ of surface, while the material treated by the method of the invention had only a single such defect (corrosion test: Standard Methods of the Laboratoire Suisse de la recherche horlogere, Neuchatel, Switzerland).

EXAMPLE 5

Foreign Element—Boron

For treating formed parts of 42CrMo4 with boron, the reaction parameters for Example 4 were changed in several respects. The pressure in the reaction chamber was reduced substantially (0.09 Pa) and the temperature of the substrate during the treatment was also lowered slightly (890° C.). On the other hand, a substantially higher substrate voltage of −1200 volt was used and the treatment was continued for 6 hours. A commercially obtainable mixture of 82% diborane ($B_2H_6$) and 18% argon served as reactive gas. The gas flow of this mixture was adjusted to 12 scc/min.

EXAMPLE 6

Foreign Elements Al, Si, Ti, V or Sn

The surface treatment of formed parts of 42CrMo4 with one of the foreign elements Al, Si, Ti, V or Sn was carried out for 12 hours at a substrate voltage of only −90 volt, a gas pressure of 1.0 Pa and a temperature of 1100° C. At the same time, either the chloride of the element in question ($AlCl_3$, $TiCl_4$, $VCl_4$ or $SnCl_4$), a hydrogen compound ($SiH_4$, etc.) or metal-organic compounds, such as the cyclopentadienyl derivative $(C_5H_5)_2TiCl_2$ in a mixture with argon (41%) or hydrogen (64%) or both was used and the gas flow was adjusted to 3,000 scc/min. The compounds of this class of materials, which are not volatile at 25° C., were previously converted to the gaseous state by known methods (cf., for example, L. PATEROK, in Tribologie, vol. 1, Dokumentation des BMFT (Documentation of the BMFT), Berlin/Heidelberg/New York, 1981, pages 278–283). For example, surfaces, which had been treated under these conditions with aluminum, showed no signs of pitting even after a 6-month treatment with uranium hexafluoride ($UF_4$) (cf. VDI Guidelines No. 3822/February 1984, item 4.1.3).

EXAMPLE 7

Foreign Elements P or S

Conditions similar to those in Example 3 (a pressure of 0.6 Pa, a temperature of 780° C., a treatment time of 8 hours and a substrate voltage of −400 volt) proved to be appropriate for the surface treatment with these two elements. Mixtures of 10 volume percent of the hydride in question ($H_2S$ or $PH_3$, etc.) and 90 volume percent of hydrogen with average gas flows (370° C.) were used as reactive gases. These hydrides were pretreated by known methods (cf. WINNACKER/KUCHLER, Chemische Technologie, vol. 1, 3.A. Munich 1970, page 416).

EXAMPLE 8

Combination of Ti and N

A mixture of 10 volume percent of $TiCl_4$, 20 volume percent of hydrogen and 70 volume percent of nitrogen, at a low gas flow in the reaction chamber (260 scc/min), served as reactive gas. The remaining reaction conditions are comparable with those of Example 2 (a pressure of 0.3 Pa, a temperature of 1050° C. and a treatment time of 1.5 hours at a substrate voltage of −200 volt). The average number of shots of a screw conveyor of steel, DIN No. 1.8515, was increased by this surface treatment from 2.8 to 8.7 million.

EXAMPLE 9

Two-Step Method—Ti and N

In a first phase, the surface of the formed parts of 42CrMo4 was treated with a mixture of 30 volume percent of $TiCl_4$ and 70 volume percent of hydrogen at a gas flow of 260 scc/min (0.3 Pa, 1050° C., 1.5 hours at a substrate voltage of −120 volt). In a second phase, the treatment was carried out with a mixture of 40 volume percent of nitrogen and 60 volume percent of hydrogen at a gas flow of 280 scc/min and the temperature was lowered from 1050° to 600° C. by switching off the heater (treatment time of 30 minutes, substrate voltage of −200 volt). The properties of the surfaces of the workpiece, treated by this two-step method, are superior to those of surfaces treated as described in Example 8.

TABLE 1 is a compilation of suitable reaction parameters for carrying out the method of the invention.

EXAMPLE 10

Combination with PVD

Formed parts of S 6-5-2 high-speed steel were nitrided for 1 hour in a first step of the method under the reaction conditions of Example 1. In a subsequent, so-called PVD process (physical vapor deposition), they were provided with a layer of titanium nitride (TiN). For this purpose, metallic titanium was vaporized at a temperature of about 1900° C. from the crucible in the equipment described in the Swiss Patent Application No. 928/85-0 of 3-1-1985. At the same time, nitrogen was introduced as reaction gas, an argon partial pressure of 0.02 Pa and a nitrogen partial pressure of 0.08 Pa being maintained in the coating chamber at an arc voltage of 74 volts and an arc current of 74 amperes. Under these conditions, a coating rate of 4.1 A/sec was attained. The layers obtained showed exceptional hardness and adhered tenaciously to the steel substrate used. Aside from the ion plating process used, the two processes of cathode sputtering and spark vaporizing also appear to be suitable for applying an appropriate layer by the PVD method.

EXAMPLE 11

Combination with CVD

In a first step of the method, formed parts from the Ck 15 material were treated for 3 hours under the reaction conditions of Example 3 with a gas mixture of 80 volume percent acetylene and 20 volume percent hydrogen. In the subsequent second step of the method, a layer of titanium carbide (TiC), about 3 μm thick, was applied on the treated surface. For this purpose, a gas mixture of titanium tetrachloride ($TiCl_4$) and methane ($CH_4$) was introduced during 40 minutes at a gas pressure of 0.4 Pa, a temperature of 920° C. and a substrate voltage of −460 volt. The gas mixture was metered with the help of the gas flow of the two individual gases, which was 430 scc/min for TiCl4 and 640 scc/min for CH4 (Swiss Patent Application No. 2610/85-0, Example 6). The titanium tetrachloride was pretreated by known methods (cf., for example, PATEROK, loc. cit. pages 278 ff; 283).

EXAMPLE 12

Combination with PVD and CVD

In a first step of the process, workpieces of 18/8 steel were treated under the reaction conditions described in Example 4 with the foreign element chromium. In a subsequent second step of the process, the surface, so treated, was provided with a layer of titanium nitride by the PVD method (physical vapor deposition), as described in Example 10. Aside from the method of ion plating, the two methods of cathode sputtering and spark vaporizing also appear to be suitable for applying such a layer. In a final step of the process, the workpieces were coated by the CVD method (chemical

TABLE I

| | | | | | | Reactive Gas | | |
|---|---|---|---|---|---|---|---|---|
| Example | Foreign Element | Pressure Pa | Temperature °C. | Duration Hours | Substrate Voltage | 1 (Vol %) | 2 (Vol %) | Gas Flow Scc. Min. |
| 1 | N | 0.5 | 530 | 1 | 600 | $N_2$ (15) | Ar (45), $H_2$ (40) | 390 |
| 2 | C, N | 0.4 | 480 | 1 | 400 | $N_2$ (25) | $C_6H_6$ (75) | 420 |
| 3 | C | 0.2 | 920 | 3 | 580 | $C_2H_2$ (80) | $H_2$ (20) | 800 |
| 4 | Cr | 0.4 | 980 | ⅞ | 60 | $CrCl_2$ (70) | $H_2$ (30) | 410 |
| 5 | B | 0.09 | 890 | 6 | 1200 | $B_2H_6$ ( ) | | 12 |
| 6 | Al, Si, Ti, V, Sn | 1.0 | 1100 | 12 | 90 | $AlCl_3$, $SiH_4$, $TiCl_4$, $VCl_5$, $SnCl_2$ Ti $(C_3H_7)_4$ | | 3000 |
| 7 | P, S | 0.6 | 780 | 8 | 400 | $H_2S$, $P_2H_6$ (10) | $H_2$ (90) | 370 |
| 8 | Ti, N | 0.3 | 1050 | 1.5 | 200 | $TiCl_4$ (10) | $N_2$ (70), $H_2$ (20) | 250 |
| 9 | Ti | 0.3 | 1050 | 1.5 | 120 | $TiCl_4$ (30) | $H_2$ (70) | 260 |
| | N | 0.3 | 600 | .5 | 200 | $N_2$ (40) | $H_2$ (60) | 280 | vapor deposition) with aluminum oxide (Al$_2$O$_3$). For this purpose, the workpieces were coated in the equipment of the invention at a pressure of 0.5 Pa, a substrate temperature of 980° C. and a substrate voltage of 60 volt for 90 minutes with a gas mixture of aluminum chloride (AlCl3, 33 volume percent, 670 scc/min) and water vapor (67%, 1240 scc/min). The layer, produced in this step of the process, had a thickness of approximately 3 μm (cf. Swiss Patent Application No. 2610/85-0 of 6-20-1985).

EXAMPLE 13

Two Foreign Elements with a Different Depth Distribution

In a first step of the process, formed parts of S 6-5-2 high-speed steel were nitrided for 1 hour under the reaction conditions of Example 1 with a gas mixture of 15% nitrogen, 45% argon and 40% hydrogen. Subsequently, 5 volume percent of oxygen were admixed with this gas mixture under otherwise unchanged conditions. By this procedure, an average depth of penetration of nitrogen of 100 μm was obtained, while the oxygen atoms reached an average value of only 5 μm. The surfaces, so treated, showed no defects in the salt-spray test after 90 days (cf. EP-A1 159 222; test, for example, according to DIN 50 021 or ASTM B 117). Table 2 shows suitable reaction parameters for combinations of the method of the invention with PVD and CVD methods.

EXAMPLE 14

Selective Influencing of the Ratio of the Depth Distribution of Two Foreign Elements—I Formed parts of the TiAl6V4 alloy were treated for two hours at a pressure of 0.7 Pa and a substrate temperature of 740° C. with a gas mixture of 20 volume percent nitrogen, 30 volume percent boron trichloride (BCl$_3$), 30 volume percent hydrogen and 20 volume percent argon, the gas flow being 410 scc/min. To obtain an approximately equal depth of penetration of the two foreign elements N and B of approximately 50 nm each, a substrate voltage of only −50 volt was maintained. As a result, the two foreign elements B and N were implanted (boronitrided) in random distribution up to a depth of about 5μ by conducting the process in this manner, while the more rapidly diffusing nitrogen alone is incorporated up to a depth of about 30μ. This results in a particularly deep total hardness, the hardness profile up to 29μ having a value HV$_{0.05}$ of greater than 2000.

EXAMPLE 15

Selective Influencing of the Ratio of the Depth Distribution of Two Foreign Elements—II Workpieces of the same TiAl6V4 alloy were treated under reaction conditions identical with those of Example 14 with the only difference, that the substrate voltage was adjusted to a substantially higher value of 800 V. This change results in a substantially higher depth of penetration of boron of approximately 200 nm, while that of nitrogen is increased insignificantly to about 60 nm. As a result, a particularly hard surface layer is obtained, which contains the foreign elements B and N next to one another in random distribution up to a depth of approximately 8μ and a hardness of which HV$_{0.05}$ was measured to be about 3000.

TABLE II is a compilation of suitable reation parameters for carrying out the method of the invention.

While specific embodiments of the invention have been shown and described in detail to illustrate the application of the principles of the invention, it will be understood that the invention may be embodied otherwise without departing from such principles.

TABLE II

| | | | | | | | | |
|---|---|---|---|---|---|---|---|---|
| Reaction Parameters for Combinations with PVD, CVD | | | | | | | | |
| Example | Foreign Element | Pressure | Temperature °C. | Duration Hours | Substrate Voltage Volt | Reactive Gas 1 (Vol %) | 2 (Vol %) | Gas Flow Scc/Min. |
| 10 | 1. N | 0.5 | 530 | 1 | 600 | N$_2$ (15) | (45, H$_2$ (40)) | 390 |
| | 2. TiN | 0.08 N$_2$ | (1900) | — | — | N$_2$ (80) | Ar (20) | — |
| 11 | 1. C | 0.2 | 920 | 3 | 580 | C$_2$H$_2$ (80) | H$_2$ (20) | 800 |
| | 2. TiC | 0.4 | 920 | 40′ | 460 | TiCl$_4$ | CH$_4$ | 430/640 |
| 12 | 1. Cr | 0.4 | 980 | 40′ | 60 | CrCl$_2$ (70) | H$_2$ (3a) | 410 |
| | 2. TiN | 0.1 | (1900) | — | — | N$_2$ (80) | Ar (20) | — |
| | 3. Al$_2$O$_3$ | 0.4 | 530 | 1.5 | 60 | AlCl$_3$ (33) | H$_2$O (67) | 670/1240 |
| 13 | 1. N | 0.5 | 530 | 1 | 600 | N$_2$ (15) | Ar (45), H$_2$ (40) | 390 |
| | 2. O | 0.5 | 530 | 20′ | 600 | O$_2$ (5) | N$_2$, Ar, H$_2$ | 390 |
| 14 | 1. B | 0.7 | 740 | 2 | 50 | N$_2$ (20), BCl$_3$ (30), H$_2$ (30), Ar (20) | | 410 |
| | 2. N | | | | | | | |
| 15 | 1. B | 0.7 | 740 | 2 | 800 | N$_2$(20), BCl$_3$(30), H$_2$(30), Ar(20) | | 410 |
| | 2. N | | | | | | | |

What is claimed is:

1. A method for the thermochemical surface treatment of materials in a reaction chamber the method comprising the steps of: maintaining a gas pressure in the reaction chamber of less than 10 pascals (Pa) generating a gas plasma in an arc discharge of low voltage having a low current density lying in the range of $10^5$ to $7 \times 10^5$ A/m$^2$ and treating the materials in the reaction chamber with said reactive gas plasma.

2. The method according to claim 1, wherein the pressure lies in the range of 0.06 to 0.6 pascals (Pa).

3. The method according to claim 1, wherein said step of treating in a gas plasma includes generating the gas plasma in an arc discharge the electrical arc being discharged between a heated, gas-stabilized cathode and a liquid-cooled anode.

4. The method according to claim 2, wherein the arc discharge is used simultaneously to generate the gas plasma and to heat a substrate positioned in the reaction chamber.

5. The method according to claim 1 wherein the materials to be treated are subjected to a plasma-chemical etching before the thermochemical surface treatment in the gas plasma.

6. The method according to claim 1 further comprising the step of: implanting different foreign elements at consecutive times in the substrate surface by changing the process parameters.

7. The method according to claim 1 wherein the surface treatment in the gas plasma is supplemented by a coating process in the gas plasma, including applying a coating material on the substrate by physical processes (so-called physical vapor deposition or PVD).

8. The method according to claim 7, wherein the physical coating process includes one of the steps of ion plating, cathode sputtering and spark vaporization or any combination of these.

9. The method according to claim 7, wherein the surface is treated in a first step with nitrogen and a coating of titanium nitride is applied in a second step according to the PVD process.

10. Method as defined in claim 9, wherein the second step of the process consists of ion plating.

11. The method according to claim 1 wherein the surface treatment in the gas plasma is supplemented by a coating process in the gas plasma, including applying the coating material on the substrate by chemical processes (so-called chemical vapor deposition or CVD).

12. The method according to claim 1 wherein the surface treatment in the gas plasma is supplemented by the step of coating utilizing physical processes (PVD) as well as coating utilizing chemical processes (CVD).

13. The method according to claim 1 further comprising the step of introducing one or several of the following elements: boron, carbon, nitrogen, aluminum, silicon, phosphorus, sulfur, titanium, vanadium, chromium, tin, into the surface of the substrate.

14. The method according to claim 1 further comprising the step of generating magnetic lines of flux guiding the arc discharge.

15. The method according to claim 14 wherein the magnetic lines of flux guiding the arc discharge are perpendicular to the flow of the a reactive gas or gas mixture.

16. A method of treating the surface of an article comprising the steps of: positioning the article within a reaction chamber; maintaining a gas pressure in the reaction chamber of less than 10 pascals (Pa) generating a gas plasma in an arc discharge of low voltage having a low current density lying in the range of $10^5$ to $7\times 10^5$ A/m$^2$ and treating the article in the reaction chamber with said reactive gas plasma.

17. The method according to claim 16, wherein the pressure lies in the range of 0.06 to 0.6 pascals (Pa).

18. The method according to claim 16, wherein said step of treating in a gas plasma includes generating the gas plasma in an arc discharge the electrical arc being discharged between a heated, gas-stabilized cathode and a liquid-cooled anode and said step of positioning the article includes positioning the article on a substrate holder located between said gas-stabilized cathode and said liquid-cooled anode.

19. The method according to claim 16, wherein the arc discharge is used simultaneously to generate the gas plasma and to heat a substrate positioned in the reaction chamber.

20. The method according to claim 16, further comprising the step of: generating magnetic lines of flux guiding the arc discharge.

21. The method according to claim 21, wherein the magnetic lines of flux guiding the arc discharge are perpendicular to the flow of the a reactive gas or gas mixture.

22. The method according to claim 16, wherein said article has at least two different implanted foreign elements, the depth distribution of which differs with respect to the average value, as well as with respect to the standard deviation.

23. The method according to claim 22 wherein said article originally has two different implanted foreign elements, the average values of the depth distribution of which are inversely proportional to the reaction enthalpy of the element in question with the sub strate material.

24. A product treated by a process comprising the steps of: positioning the untreated product within a reaction chamber on a substrate; introducing gas into the reaction chamber and maintaining a gas pressure in the reaction chamber of less than 10 (Pa); generating a gas plasma in an arc discharge of low voltage having a low current density lying in the range of $10^5$ to $7\times 10^5$ A/m$^2$, the gas plasma being generated with an electrical discharged between a heated gas-stabilized cathode and a liquid-cooled anode, said substrate being positioned between the cathode and the anode; and, treating the article in the reaction chamber with said reactive gas plasma.

25. The product-by-process according to claim 24, further comprising the steps of: generating magnetic lines of flux guiding the arc discharge for treating the article in the reaction chamber with said reactive gas plasma.

26. The product-by-process according to claim 25, wherein the magnetic lines of flux guiding the arc discharge are transverse to the flow of the reactive gas.

27. The product-by-process according to claim 24, wherein said article has at least two different implanted foreign elements, the depth distribution of which differs with respect to the average value, as well as with respect to the standard deviation.

28. The product-by-process according to claim 24, wherein: said article originally has two different implanted foreign elements, the average values of the depth distribution of which are inversely proportional to the reaction enthalpy of the element in question with the substrate material.

* * * * *